United States Patent [19]

Yamamoto et al.

[11] Patent Number: 5,151,385
[45] Date of Patent: Sep. 29, 1992

[54] METHOD OF MANUFACTURING A METALLIC SILICIDE TRANSPARENT ELECTRODE

[75] Inventors: Hideaki Yamamoto, Tokorozawa; Koichi Seki; Toshihiro Tanaka, both of Hachioji; Akira Sasano, Tokyo; Toshihisa Tsukada, Tokyo; Yasuharu Shimomoto, Tokyo; Toshio Nakano, Tokyo; Hideto Kanamori, Okazaki, all of Japan

[73] Assignee: Hitachi, Ltd., Tokyo, Japan

[21] Appl. No.: 252,144

[22] Filed: Oct. 3, 1988

[30] Foreign Application Priority Data

Dec. 16, 1982 [JP] Japan .................. 57-220641

[51] Int. Cl.$^5$ .................. H01L 21/00; H01L 21/02; H01L 29/48
[52] U.S. Cl. .................. 437/181; 437/2; 437/5; 437/200; 437/201; 148/DIG. 147; 136/256; 136/258; 136/252
[58] Field of Search .................. 437/5, 181, 192, 200, 437/201; 148/DIG. 1, DIG. 19, DIG. 147; 357/2, 71; 136/256, 258

[56] References Cited

U.S. PATENT DOCUMENTS

| | | | |
|---|---|---|---|
| 3,753,774 | 8/1973 | Veloric | 437/200 |
| 4,142,195 | 2/1979 | Carlson et al. | 437/179 |
| 4,278,704 | 7/1981 | Williams | 437/201 |
| 4,297,393 | 10/1981 | Denning et al. | 437/160 |
| 4,322,453 | 3/1982 | Miller | 437/201 |
| 4,458,410 | 7/1984 | Sugaki et al. | 437/200 |
| 4,534,099 | 8/1985 | Howe | 437/181 |
| 4,788,582 | 11/1986 | Yamamoto et al. | 437/201 |

OTHER PUBLICATIONS

Tsai, C., Summary Abstract: Metal-Amorphous Si Interfaces: Structural and Electrical Properties J. Vac. Sci. Tech. A1(2), Apr.-Jun. 1983, pp. 785-786.
Goldstein, B., Growth of Thin Platinum Films on Hydrogenated Amorphous Silicon and Its Oxide J. Vac. Sci. Tech., vol. 17, No. 3, May/Jun. 1980, pp. 718-720.
Maenpaa, M., Contact Resistivities between Solar-Cell-Type Si and Transition Metal Nitrides Aug. 1981, IEEE Conference, pp. 518-521.
Ovadyahu, Z., A Transparent-Conducting Coating for a-Si:H Based Devices Amer. Instit. of Physics, 1981, pp. 5865-5866.
Sasano, A., Semitransparent Metal-Si Electrodes for a-Si:H Photodiodes and Their Application to a Contact-Type Linear Sensor Array, Extend. Abst. of the 16th Conf. on Solid State Devices and Materials, Kobe, 1984, pp. 555-558.
Seki, K., Semitransparent Silicide Electrodes Utilizing Interaction Between Hydrogenated Amorphous Silicon and Metals, Appl. Phys. Lett. 44(7), Apr. 1984, pp. 682-683.
Anderson, J., Nickel Contacts for Low Cost Solar Cells, May 1980, IEEE Conference, pp. 948-951.
Han, M., Influence of Thin Metal as a Top Electrode on the Characteristics of P-I-N a-Si:H Solar Cells, J. Appl. Phys. 52(4), Apr. 1981, pp. 3073-3075.
Matz, R., Chemical Reaction and Silicide Formation at the Pt/Si Interface, J. Vac. Sci. Tech. A2(2), Apr.-Jun. 1984.

Primary Examiner—Brian E. Hearn
Assistant Examiner—B. Everhart
Attorney, Agent, or Firm—Antonelli, Terry Stout & Kraus

[57] ABSTRACT

A semiconductor device such as a solar cell, photodiode and solid state imaging device comprises a semiconductor layer made of amorphous silicon formed on a given substrate, and a transparent conductive layer formed by an interfacial reaction between the amorphous silicon and a metallic film directly formed on the amorphous silicon. This transparent conductive layer is used as a transparent electrode of the device and if necessary the remainder after having partially removed the metallic film for the transparent conductive layer is used as a conductive layer and light shielding film.

17 Claims, 5 Drawing Sheets

METHOD OF MANUFACTURING A METALLIC SILICIDE TRANSPARENT ELECTRODE

This invention relates to a semiconductor device having a transparent electrode and a method of manufacturing it which are applicable to a solar cell, photodiode, imaging device or the like.

As well known, such a structure as shown in FIG. 1 has been conventionally adopted in the solar cell, for instance. In FIG. 1, numeral 1 designates a substrate, 2 an under electrode, 3 a semiconductor, 4 a transparent electrode and 5 an upper electrode of a striped metal. In the structure of FIG. 1, light is irradiated to the transparent electrode 4 to extract holes and electrons so generated through the under electrode 2 and the upper electrode 5. And the photodiode, for example, has been conventionally implemented in a sectional structure such as shown in FIG. 2. In FIG. 2, numeral 6 designates a substrate, 7 an under electrode, 8 a semiconductor, 9 a transparent electrode and 10 an upper electrode for current extraction, being commonly made of metal. Light is caused to impinge on the transparent electrode 9 with the result that current according to the incident light flows between the under electrode 7 and the upper electrode 10.

As mentioned above, the conventional photosensitive element having a transparent electrode is of a double layer electrode structure in which an upper electrode made of metal is provided on the transparent electrode. This requires, as a manufacturing process, steps of forming the transparent electrode and working it; and forming the upper electrode of metal and working it. Further, as well known, an ITO (Indium Tin Oxide) is employed as a transparent electrode, which material is ordinarily formed by R.F. sputtering deposition. Thus, this material gives rise to any defects in a semiconductor surface in forming the ITO, and has a difficulty of obtaining an ITO film of good quality. Moreover, when the metal to be formed into an upper electrode is worked on the ITO film by photo-etching, ITO itself may be also dissolved since it is a material of considerably weak chemical proof. As above, there have been a number of problems to be solved to use ITO as a transparent electrode.

There are the following articles related with ITO mentioned above:
i) J. L. Vossen, RCA Rev , 32,289 (1971)
ii) U.S. Pat. No. 3749658 (1973), to J. L. Vossen In view of the foregoing, it is an object of this invention to provide a semiconductor device having a transparent electrode which can reduce a great deal of electrode making step where hydrogenerated amorphous silicon (hereinafter referred to as "a-Si:H") is used as a semiconductor layer and also solve the above mentioned problems; and a method of manufacturing it.

The gist of the device according to this invention is as follows; a semiconductor material having an a-Si:H layer is used and a transparent conductive layer, which is formed on an interface between the a-Si:H layer and a metallic film containing at least one selected from the group including Cr, Mo, W, Ti, V, Zr, Nb, Ta, Hf, Ni, Pd, Co, Pt and Rh through an interfacial reaction therebetween, is used as a transparent electrode.

Thus, the gist of the method of manufacturing the device is as follows:

An a-Si:H layer is formed on a given substrate, a given metallic film containing Cr, Mo, Pt, etc. mentioned above is formed on the a-Si:H layer and the interfacial reaction therebetween is caused to form the transparent conductive layer on the interface therebetween. And the step of removing the metallic film used to form this conductive layer is also included in this method.

Incidentally, as the metallic film, not only an elemental substance of the metals mentioned above but also the film including the above mentioned metal such as the mixture, alloy, Cr—Al, Cr—Ni, Cr—Ni—Al, etc. can be employed.

The thickness of this metallic film is not critical since it is removed after having formed the transparent conductive layer, and the thickness thereof is normally within the range of 50 to 2000 Å, and more preferably within the range of 500 to 2000 Å. An undue thin film is inferior in uniformity of the film while an undue thick film doesn't give rise to any specific advantage but increases the possibility of adversely affecting the semiconductor layer which is attributable to the stress by the metallic film.

The reacting temperature is within the range of 100° to 250° C. In particular, the temperature beyond 250° C. is not preferable since an a-Si:H will degenerate at the temperature. The reacting time is within the range of 20 minutes to one hour. Undue long heating will not provide any specific advantage.

Heat treatment may be performed either during the step of forming the metallic film (i.e. evaporation in state of heating substrate) or after having formed the metallic film.

Further, in case where the surface of the a-Si:H layer, which appears to be a so-called surface oxide layer, is removed immediately before the metallic film is formed on the a-Si:H layer, a transparent conductive layer can be formed without any specific heat treatment. That is, the heat treatment at 60° to 70° C. is performed for a sample by a metal evaporation source, thus forming the transparent conductive layer.

The a-Si:H of any one of p, i and n conduction type constitutes the transparent conductive layer. It is of course that the a-Si:H may contain an impurity such as P, B, N, C, 0 or Ge.

The amorphous silicon which terminates a dangling bond thereof by F, in place of H normally introduced for the purpose, also constitutes the transparent conductive layer.

The thus formed transparent conductive layer is sufficiently practicable from the viewpoint light transparentness and also practicable in the resistance since it is less than about 10 k$\Omega$/□.

This invention uses, as a transparent electrode, a transparent conductive layer formed by an interfacial reaction between the amorphous silicon and metal on the basis of the above discovery. In accordance with the present invention, a solar cell such as shown in FIG. 1 for example, is completed by only the steps of forming an a-Si:H on a semiconductor 3, depositing Cr thereon by evaporation by heat and removing Cr while causing a necessary Cr portion to remain. The number of fabricating steps is reduced b- half as compared with the conventional method. Such a problem as may occur in the case of using ITO does not occur. It has been confirmed in the method according to this invention that any method of vacuum-deposition, electron beam deposition and sputtering deposition naturally constitutes entirely the same transparent electrode in property. Hydrogenated amorphous silicon or n-type amorphous silicon doped with P is preferably employed in this invention. But, these amorphous silicons are susceptible to natural oxidation so that when it is left in air during one month or so, an oxidation film being several tens Å thick will be formed. Thus, forming Cr on the oxidation film will not constitute a transparent conductive layer since this oxidation film acts as a reaction stopper. Therefore, this invention must be adapted after this oxidation film has been removed by the etchant of HF system. The hydrogenated amorphous silicon doped with B is more stable than the above materials in chemical property so that even when it is left in air during ten months or so any oxidation film will not be constituted, which always allows a desired conductive layer to be obtained.

The foregoing and other objects, features and advantages of the invention will be apparent from the following, more particular description of the preferred embodiments of the invention as illustrated in accompanying drawings wherein.

Figure 1:
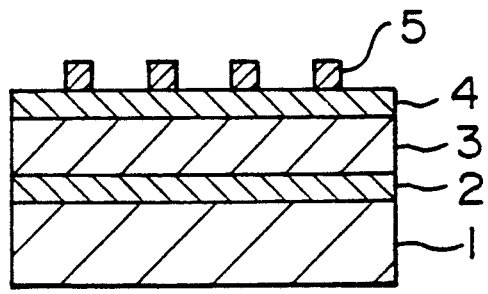
FIG. 1 is a sectional view of the conventional solar cell.
Figure 2:
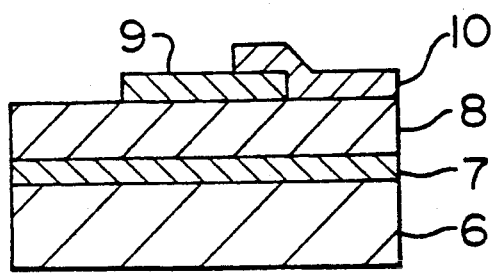
FIG. 2 is a sectional view of the conventional photodiode.

Hereinafter, explanation will be made on the embodiments referring to the drawings.

EMBODIMENT 1

Figure 3:
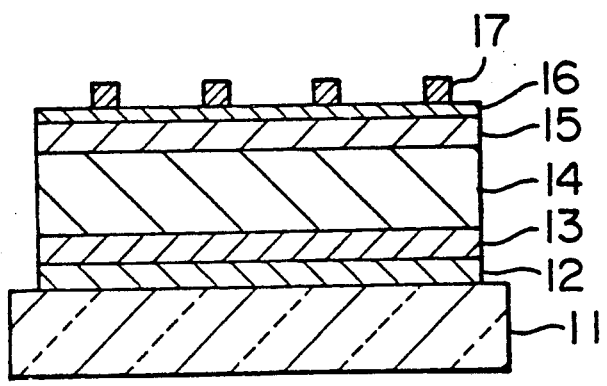
FIG. 3 is a sectional view of one embodiment of the solar cell according to this invention.

The example in which this invention is applied to a solar cell will be explained referring to FIG. 3.

First, a Cr electrode 12 is formed on a glass substrate 11 by sputtering deposition in an atmosphere such as Ar gas, with its film thickness being 0.3 μm. Plasma CVD (Chemical Vapor Deposition) is performed at the substrate temperature of 230° C. to form a hydrogenated amorphous silicon (a-Si:H) 13 containing P (n-layer) on the Cr electrode 12 using a mixed gas composed of $PH_3$ gas and $SiH_4$ gas (mixture ratio: $PH_3/SiH_4 \geq 0.5$ V %); to form an a-Si:H 14 (i-layer) on the n-layer using only $SiH_4$ gas: and to form an a-Si:H 15 containing B (p-layer) on the i-layer using a mixed gas composed of $B_2H_6$ gas and $SiH_4$ gas (mixture ratio: $B_2H_6/SiH_4 \geq 0.5$ V %), sequentially. The film thickness of each layer may be about 300 Å for the n-layer, about 5400 Å for the i-layer and about 200 Å for the p-layer, for example. Next, at the substrate temperature within the range of 100° to 250° C. since the reacting speed slows down at the temperature below 100° C. while a higher proportion of hydrogen atoms may be decomposed at the temperature above 250° C., deposition is performed to form a Cr layer being 0.1 μm thick on the entire surface of the P-layer, succeeded by forming an Al layer being 1 μm thick thereon. The time required for heat treatment in this case is about 60 to 30 minutes. Although it is of course that only the Cr layer may be formed with the thickness of 0.4 μm, it is more advantageous to use the Al layer since it reduces an electric resistance. Namely, the range of 0.1 to 0.4 μm about the thickness of the Cr layer is preferably used since it facilitates succeeding treatments and places the electric resistance within an optimum range. In the final step, photoetching is performed to remove the Cr—Al portion other than the Cr—Al portion to be a stripe electrode 17. Incidentally, a phosphoric acid etching liquid is used for Al while ammonium cerium (IV) nitrate solution is used for Cr. Thus, a transparent electrode 16 and the stripe electrode 17 are formed, thereby completing a solar cell. In the embodiment mentioned above, the a-Si:H's are stacked on the glass substrate 11 in the order of n, i and p layer, but they may be stacked in the entirely opposite order (i.e. p, i and n).

EMBODIMENT 2

Figure 4A:
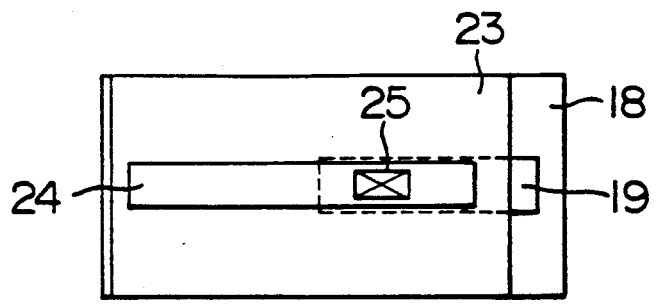
FIGS. 4A and 4B are a plan view and sectional view of one embodiment of the photodiode according to this invention, respectively.
Figure 4B:
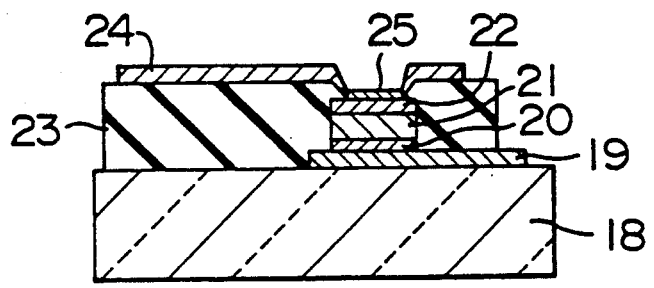

The example in which this invention is applied to a photo diode will be explained referring to FIGS. 4A and 4B which are a plan view and sectional view, respectively.

First, a Cr layer being 0.3 μm thick is formed on a glass substrate 18 and photoetching is performed for the Cr layer to form a Cr electrode 19. As in the embodiment 1, an n-layer 20, i-layer 21 and p-layer, which are a-Si:H's, respectively, are sequentially formed on the Cr electrode 19 by means of plasma CVD and thereafter photoetching is performed to remove the a-Si:H while a part of the a-Si:H is left. It is carried out by plasma asher using $eCF_4$ gas. Thereafter, an $SiO_2$ layer 23 being 2 μm thick is formed on the resultant entire surface by sputtering deposition and the $SiO_2$ on the a-Si:H and the peripheral portion of the substrate is removed by photoetching. The $SiO_2$ is removed by a hydrofluoric acid etching liquid. And at the substrate temperature of the range of 100° to 250° C., another Cr layer being 0.1 μm thick and an Al layer being 1 μm thick are formed on the resultant surface by vacuum deposition. At the final step, the Cr-Al layer other than a part 24 of the Cr—Al layer is removed by photoetching. It is of course that the Cr—Al layer on a contact hole in the $SiO_2$ layer 23 on the a-Si:H layers is removed. A transparent electrode 25 remains on the contact hole, which is formed by the interdependence (interfacial reaction) between the Cr—Al layer and the a-Si:H, and is to be a light window for the photodiode. As described above, when the Cr—Al layer corresponding to the portion to which light is intended to be incident is removed, the transparent electrode remains on the portion while the remaining Cr—Al layer also acts as a metal for light shading, thereby specifying a light window area correctly and easily. Thus, the photodiode is completed.

For simplicity of explanation, the example of making one photodiode has been described in the above. However, one dimentional or two-dimentional photodiode array can be easily made in entirely the same manner by replacing a photomask. Incidentally, in the above embodiment, the Al layer is formed on the Cr layer, but in place of Cr a metal such as CrNi having Cr as a main component, Mo or W can be used and instead of Al, such a metal as Au, Ni and Pt can be used. And the p-layer 22 of a-Si:H can be done without in practical use.

EMBODIMENT 3

Figure 5:
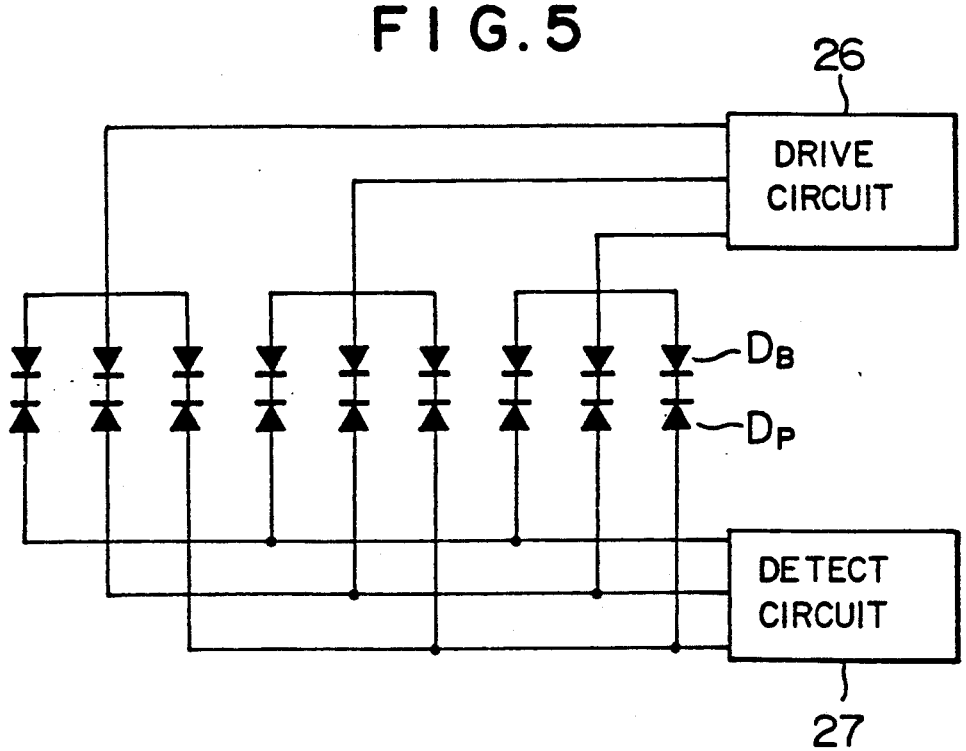
FIG. 5 is a diagram for explaining a sensor of matrix drive contact type.

There has been proposed a matrix contact type sensor as a linear sensor array such as disclosed in Japanese Patent Application Laid-Open No. 52-129258 laid open on 1982. As shown in FIG. 5, this kind of sensor is of a configuration in which a plurality of pair of diodes (designated with $D_B$ and $D_P$ in the figure) connected in series the polalities of which are opposite to each other are ,arranged in one dimension. In FIG. 5, numeral 25 designates a drive circuit and 27 is a detect circuit.

Figure 6A:
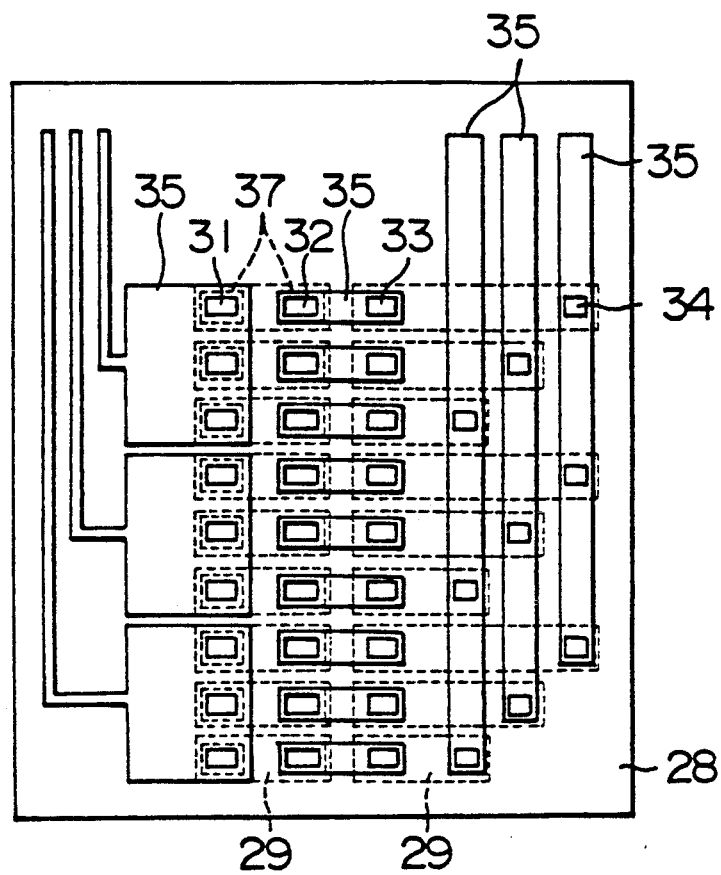
FIG. 6A and 6B are a plan view and a sectional view of one embodiment according to this invention.
Figure 6B:
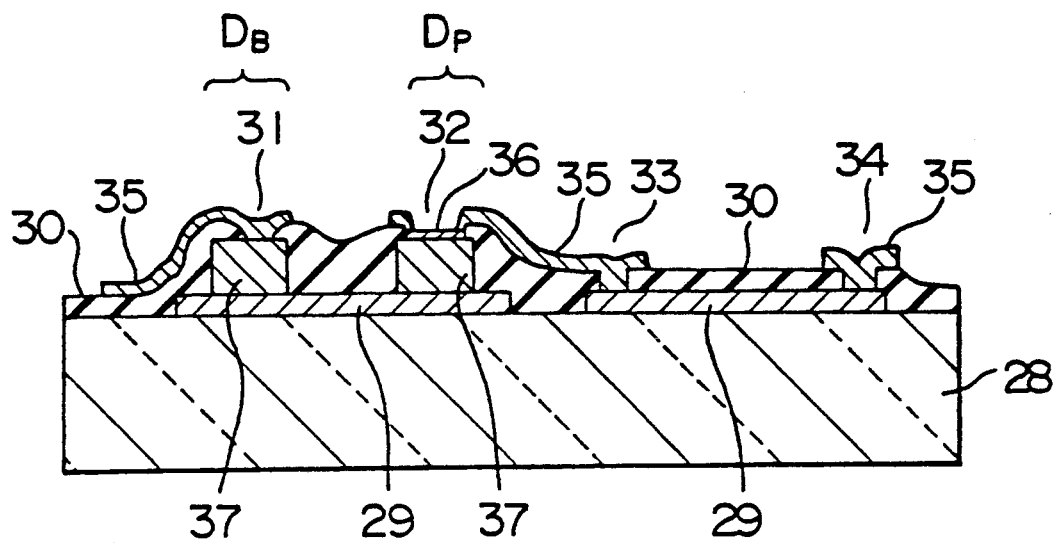

This invention is most suitable to fabricate a linear sensor array of diode arrangement. The fabricating process will be explained referring to FIGS. 6A and 6B which illustrate a plan structure and a sectional structure, respectively. A Cr film being 0.2 μm thick is formed on a glass substrate 28 at the substrate temperature of 200° C. by vacuum deposition or sputtering deposition. Next, a Cr electrode 29 is formed by photoetching. As in the embodiments 1 and 2, an a-Si:H film 37 is stacked and worked as shown in the figure. This film is formed at the substrate temperature of 200 to 250° C. by plasma CVD (Chemical Vapor Deposition). This film includes an n-layer, an i-layer and a p layer. And the n-layer is formed using a mixed gas composed of $PH_3$ gas and $SiH_4$ gas (mixture ratio: $PH_3/SiH_4 \geq 0.5$ vol %) as a raw material gas. The i-layer is formed using $SiH_4$. The p-layer is formed using a mixed gas composed of $B_2H_6$ gas and $SiH_4$ gas (mixture ratio: $B_2H_6/SiH_4 \geq 0.5$ vol %). The film thickness of each layer may be about 300 Å (n-layer), about 5400 Å (i-layer) and about 250 Å (p-layer). This a-Si:H film is etched while causing the portion to be diodes to remain. Next, an insulating film 30 such as $SiO_2$ glass is formed with the thickness of upwards of 1 μm by sputtering deposition and contacts holes 31, 32, 33 and 34 are photo-etched. Hydrofluoric acid is employed as an etching liquid. A Cr film being 0.1 μm thick and an Al film being 1.5 μm thick are formed on the resultant entire surface at the substrate temperature of 100° to 250° C. Thereafter, a Cr—Al electrode 35 is formed by photoetching, and at a same time the Cr—Al film is removed in the contact hole 32 on the photodiode. Thus, a transparent electrode 36 of transparent conductive layer remains on the photodiode, which is to be a window for incident light. As such, the application of this invention to this embodiment ensures that a linear sensor array sensor of matrix drive type is made through a simple and easy fabricating process. Although the Cr electrode 29 was employed in this embodiment such a metal as Ta, NiCr, Mo, W, Al, Pt, Pd, Ni etc. can also be used as an electrode. The multiple layer including these metals may be used.

Furthermore, in this embodiment the double layer composed of Cr and Al was adopted as a metal film for developing a transparent electrode and the upper metallic wiring 35 obtained by working the metal film. A single layer or multiple layer, however, may be used provided that its structure is such that one selected from the group including Cr, Mo, Ti, V, Zr, Nb, Ta, W, Hf, Ni, Pd, Co, Pt and Rh or the metal having the selected one element as a main component is in contact with the amorphous silicon film. And in this embodiment, stacking was carried during heating but heating may be performed at 100° to 250° C. after the stacking.

Moreover, although a blocking diode was placed at a common electrode side in this embodiment, the blocking diode and the photodiode may be replaced by each other.

Figure 7A:
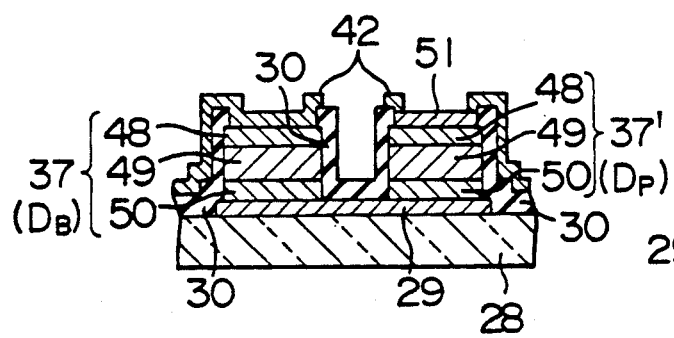
FIG. 7A-7F, FIG. 8 and FIG. 9 are sectional views of other embodiments according to this invention, respectively.
Figure 7B:
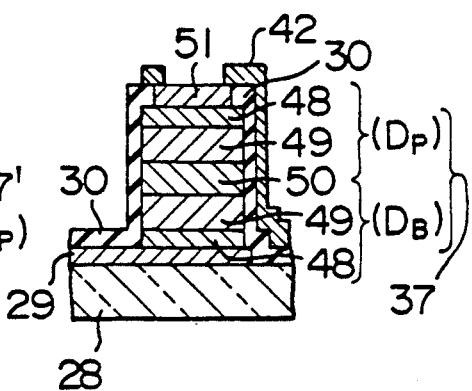
Figure 7C:
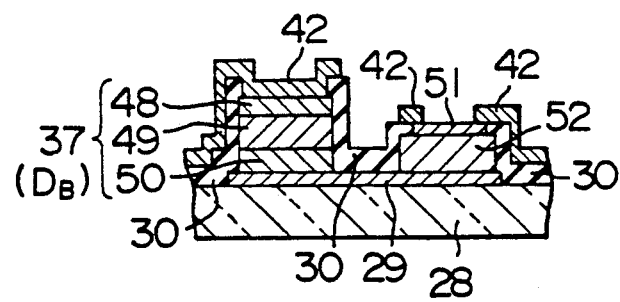
Figure 7D:
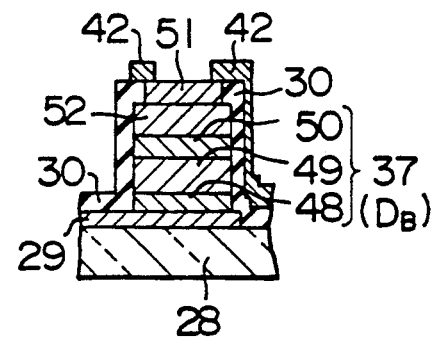
Figure 7E:
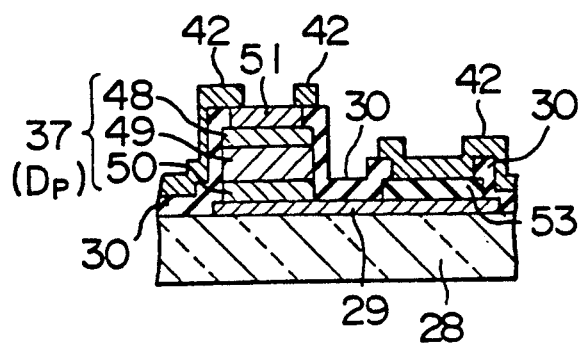
Figure 7F:
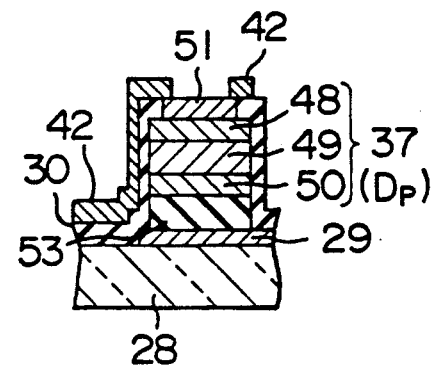

There are liner sensor array arrangements such as shown in FIGS. 7A to 7F in addition to the above described arrangement. One photosensitive element is constituted by the blocking diode $D_B$ and the photodiode $D_P$ in FIGS. 7A and 7B, by the blocking diode $D_B$ and a photoconductive film 52 in FIGS. 7C and 7D, and by the photodiode $D_P$ and a capacitor consisting of an upper metal electrode 42, an insulator 53 and an under metallic electrode 29 in FIGS. 7E and 7F, respectively. FIGS. 7A, 7C and 7E illustrate such a structure that two cells are arranged horizontally while FIGS. 7B, 7D and 7F illustrate such a structure that they are arranged vertically. It is evident that this invention is applicable to all the structures shown in these figures in such a manner that the previously mentioned transparent electrode is formed on only the contact hole over the photodiode and the photoconductive film as a window for incident light in these figures. In this embodiment, a p-i-n diode was adopted for each diode but a Schottky diode may also be employed.

Incidentally, in FIGS. 7A to 7F, reference numeral 28 designates a glass substrate; 29 an under metallic electrode; 30 an insulating film; 37, 37' a semiconductor material for constituting a diode; 40, 49, 50 a p-type semiconductor layer, i-type semiconductor layer and n-type semiconductor layer, respectively; 42 an upper metallic electrode; and 51 a transparent electrode according to this invention.

EMBODIMENT 4

Figure 8:
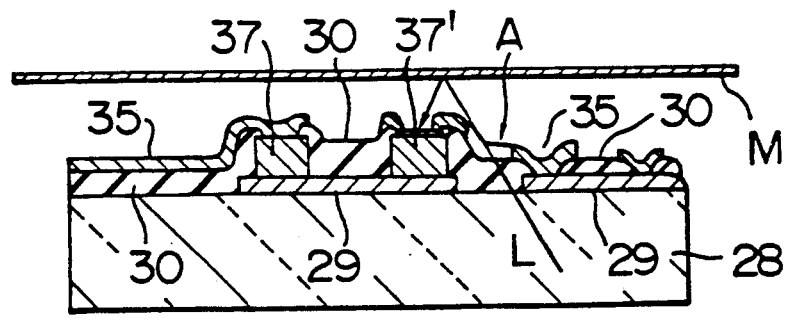

The sectional structure of this embodiment is illustrated in FIG. 8, which is the same as the embodiment 3 except that in the embodiment 3 the transparent electrode 36 is caused to remain on only the photodiode while in this embodiment 4, Cr—Al, which corresponds to the part indicated by letter "A" in the neighbourhood of the photodiode, is removed to form a hole. Such an arrangement enables the light L to enter from the lower side of the glass substrate 28 as indicated by an arrow. That is, this arrangement can be adapted to such a device that the light L is caused to enter from the lower side of the glass substrate 28, and the light reflected at a manuscript M placed in proximity to the sensor is caused to enter the photodiode thereby to read the manuscript M through photo-electric conversion.

EMBODIMENT 5

Explanation will be made on the embodiment that this invention is adapted to a solid state imaging device using a photoconductive film.

Figure 9:
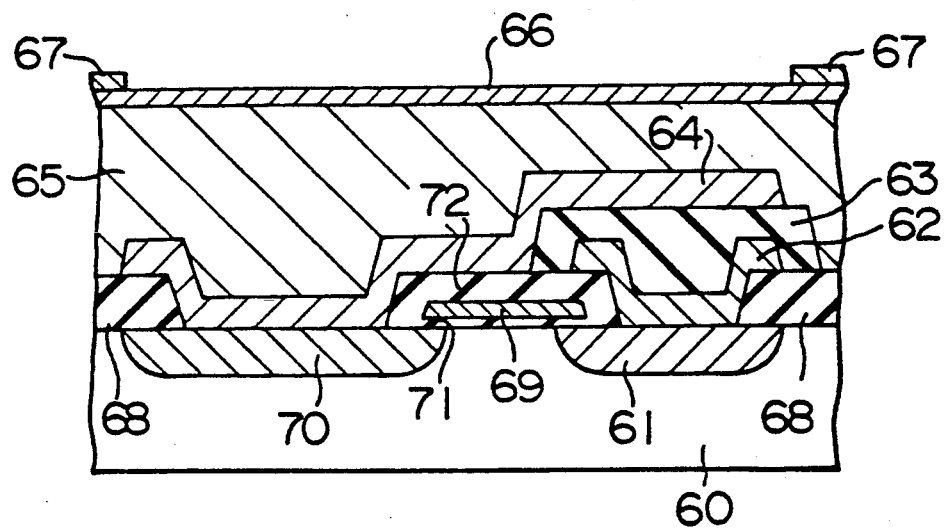

As disclosed in Japanese Patent Application Laid-Open No. 51-10715 laid open on 1981, this device is such that a photoconductive film made of a photoconductor such as an a-Si:H for photo-electric conversion is formed on a semiconductor substrate (IC substrate for scanning) having at least switches two-dimentionally arranged and a scanner for transmitting photoelectrons derived through the switches and corresponding to an optical image. FIG. 9 shows a basic structure of this device. The IC part for scanning is made by an ordinary process for manufacturing a semiconductor device. First, a thin $SiO_2$ film being about 800 Å is formed on a p-type Si substrate 60, and an $Si_3N_4$ is formed on a predetermined area of the $SiO_2$ film, with its thickness being about 1400 Å. The $SiO_2$ film is made by a common CVD technique and the $Si_3N_4$ film is made by the CVD technique in $N_2$ atmosphere. Next, the Si substrate is subjected to local oxidation in such an atmosphere as $H_2:O_2=1:8$ to form an $SiO_2$ layer 68. This method is directed to local oxidation of Si for an isolation between elements commonly called LOCOS. The above $Si_3N_4$ film and $SiO_2$ film are once removed partially and a gate insulating film 71 for an MOS transistor is formed by an $SiO_2$ film.

Next, a gate portion 69 of polysilicon and, diffusion areas 70, 61 are formed and an $SiO_2$ film 72 is formed on the resultant surface. A window for deriving an electrode for the diffusion area 61 is bored in this film 72 by etching. Al is deposited to form an electrode with its thickness being 8000 Å. An $SiO_2$ film 63 being 1500 Å thick is formed, an window for deriving an electrode is bored on the diffusion area 7a by etching, and Al or Mo is deposited with its thickness of 1 μm as an electrode 64. Incidentally, the electrode 64 is formed so wide as to cover the diffusion areas 70 and 61 and the gate portion. This is because an incident light to a signal processing area between elements may cause an undesired blooming.

Figure 10:
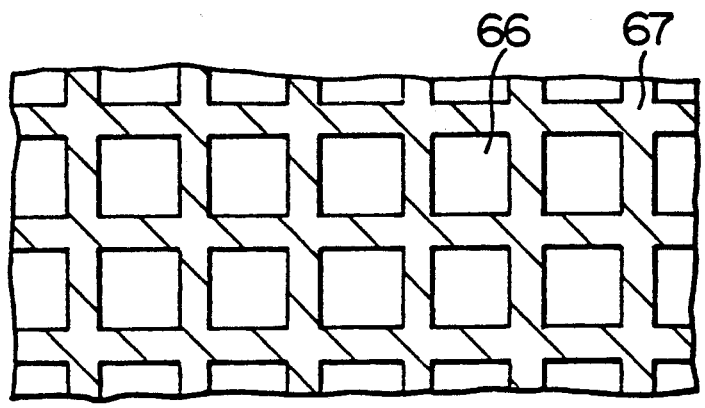
FIG. 10 is a plan view of the embodiment of FIG. 9 according to this invention.

A photoconductive film 65 is formed by sputtering in an atmosphere of the mixed gas composed of Ar and H at 0.2 Torr. The hydrogen condent is 6 mol %. That is, the reactive sputtering is performed at a frequency of 13.56 MHz and input of 300 W using a silicon target to stack the photoconductive film 65 of 1 μm on the IC substrate for scanning. Thereafter, Cr is stacked by 2000 Å at the substrate temperature of 100° to 250° C. by sputtering or vacuum deposition. Next, patterning is carried out so as to section the photosensitive element as shown in a plan view of a photosensitive part of FIG. 10. Thus, a transparent conductive film 66 is formed on the photosensitive element, which also acts as a shading 67 enhance a resolution so as to restrict an angle of the incident light for one photosensitive element.

Although MOS transistor was used as a scanning IC in this embodiment, a CCD or BBD may also be adapted in place of the MOS transistor.

Where the shading 67 is not required, the remainder of Cr at only the peripheral portion of a photoconductive layer will not cause any serious problem.

B and P were used as a dopant for the a-Si:H in this embodiment, but it is evident that N, C, 0, G, etc. may be used., And F may be used as a terminator of a dangling bond instead of H.

We claim:

1. A method of manufacturing a semiconductor device comprising the steps of forming a hydrogenated amorphous silicon (a-Si:H) layer over a given substrate; forming a metallic film on said hydrogenated amorphous silicon layer; effecting a heat treatment of the metallic film after formation of the metallic film to produce a transparent conductive layer by an interfacial reaction between said hydrogenated amorphous silicon layer and said metallic film; and removing at least a desired area of the metallic film to expose a portion of the transparent conductive layer for light incidence.

2. A method of manufacturing a semiconductor device according to claim 10, wherein at least a portion of said metallic film in contact with said hydrogenated amorphous silicon layer is formed from at least one metal selected from the group consisting of Cr, Mo, W, Ti, V, Zr, Nb, Ta, Hf, Ni, Pd, Co, Pt and Rh.

3. A method of manufacturing a semiconductor device according to claim 2, wherein said metallic film is composed of plural layers and the layer in contact with the hydrogenated amorphous silicon layer contains at least one metal selected from said group.

4. A method of manufacturing a semiconductor device according to claim 1, wherein an under electrode is formed on said substrate and said amorphous silicon layer is formed on said under electrode.

5. A method of manufacturing a semiconductor device according to claim 1, wherein a remaining portion of said metallic film retained on said transparent conductive layer serves as an electrode or light shielding film.

6. A method of manufacturing a semiconductor device according to claim 5, wherein said electrode has a stripe form.

7. A method of manufacturing a semiconductor device according to claim 1, wherein all the entire area of said metallic film is removed.

8. A method of manufacturing a semiconductor device comprising the steps of forming a hydrogenated amorphous silicon (a-si:H) layer over a given substrate; forming a metallic film on said hydrogenated amorphous silicon layer during a heat treatment to produce a transparent conductive layer by an interfacial reaction between said hydrogenated amorphous silicon layer and said metallic film; and removing at least a desired area of the metallic film to expose a portion of the transparent conductive layer for light incidence.

9. A method of manufacturing a semiconductor device according to claim 8, wherein said metallic film is formed from at least one metal selected from the group consisting of Cr, Mo, W, Ti, V, Zr, Nb, Ta, Hf, Ni, Pd, Co, Pt and Rh.

10. A method of manufacturing a semiconductor device according to claim 9, wherein said metallic film is composed of plural layers and the layer in contact with the hydrogenated amorphous silicon layer is formed from said at least one metal selected from said group.

11. A method of manufacturing a semiconductor device according to claim 8, wherein after said amorphous silicon layer is formed, a surface layer thereof is removed and then said metallic film is formed.

12. A method of manufacturing a semiconductor device according to claim 8, wherein an under electrode is formed on said substrate and said hydrogenated amorphous silicon layer is formed on said under electrode.

13. A method of manufacturing a semiconductor device according to claim 8, wherein a remaining portion of said metallic film retained on said transparent conductive layer serves as an electrode or light shielding film.

14. A method of manufacturing a semiconductor device according to claim 13, wherein said electrode has a stripe form.

15. A method of manufacturing a semiconductor device according to claim 8, wherein the entire area of said metallic film is removed.

16. A method of manufacturing a semiconductor device according to claim 1, wherein said heat treatment is conducted at temperatures within the range of 100° C. to 250° C.

17. A method of manufacturing a semiconductor device according to claim 8, wherein said heat treatment is conducted at temperatures within a range of 60° C. to 70° C.

* * * * *